(12) United States Patent
Dickens et al.

(10) Patent No.: US 7,277,104 B2
(45) Date of Patent: Oct. 2, 2007

(54) VIDEO SIGNAL SKEW

(75) Inventors: Nigel Anthony Dickens, Cambridge (GB); Adrian Christopher Dickens, Cambridge (GB); Darrin Steel, Cambridge (GB)

(73) Assignee: Adder Technology Ltd., Cambridge (GB)

( * ) Notice: Subject to any disclaimer, the term of this patent is extended or adjusted under 35 U.S.C. 154(b) by 514 days.

(21) Appl. No.: 10/372,039

(22) Filed: Feb. 19, 2003

(65) Prior Publication Data

US 2004/0017514 A1    Jan. 29, 2004

(30) Foreign Application Priority Data

Feb. 26, 2002    (GB)    ................. 0204427.9

(51) Int. Cl.
*G09G 5/10* (2006.01)

(52) U.S. Cl. ..................... 345/691; 327/161
(58) Field of Classification Search ............... 345/205, 345/204, 691, 211–215; 713/503; 333/17.3, 333/22, 124, 253, 263; 327/161
See application file for complete search history.

(56) References Cited

U.S. PATENT DOCUMENTS 3,681,693 A    8/1972    Hsueh
5,826,167 A * 10/1998 Jelinek et al. ............... 725/121
5,861,764 A *  1/1999 Singer et al. ................. 326/93
6,347,041 B1 *  2/2002 Hailey et al. ............... 361/777
6,675,313 B2 *  1/2004 Cuthbert ..................... 713/503
2005/0024109 A1 *  2/2005 Amin ......................... 327/161

FOREIGN PATENT DOCUMENTS

| JP | 63-164786 | 7/1988 |
|---|---|---|
| JP | 2-189093 | 7/1990 |
| WO | WO03/055094 A1 | 7/2003 |

* cited by examiner

*Primary Examiner*—Bipin Shalwala
*Assistant Examiner*—Steven Holton
(74) *Attorney, Agent, or Firm*—Beyer Weaver LLP (57) ABSTRACT

Devices for reducing and determining the skew between colour video signals transmitted over at least two different video cables are described. A KVM extender including such devices is also described. The skew reduction device includes a plurality of video signal transmission tracks selectably connectable to each of the video cables to increase the video signal transmission path length so as to more closely matching the total video signal path length for each of the colour video signals. The skew determination device comprises a processing device, a signal generator for applying measuring signals to each of the video signal cables and signal detection circuitry to receive measuring signals transmitted over the video signal cables. Detection signals are output to the processing device which is programmed to determine an indication of the transmission path length difference between the video signal cables.

12 Claims, 7 Drawing Sheets

VIDEO SIGNAL SKEW

BACKGROUND OF THE INVENTION

The present invention relates to video signal skew, and in particular to devices and methods for determining and compensating for skew between video signals transmitted over wires.

When video colour signals are separately transmitted over wires of different lengths, then the signals become temporally separated (skewed) which degrades the image generated by a video display device. This can particularly be a problem in a class of devices known as KVM (Keyboard, Video monitor and Mouse) extenders. These devices allow a KVM console to be used to control a distant computer over distances of several hundred metres.

Such devices often use twisted pair cabling to transfer video signals from the computer to the monitor, and data and control signals between the computer and mouse and keyboard. However, twisted pair cables are more suited to carrying high speed digital signals, rather than analogue video signals. Different pairs of cables have different twist rates, i.e. number of twists per unit length, in order to reduce crosstalk between the pairs and improve their high speed digital performance.

The different twist rates means that different pairs extending over the same distance will actually have different signal path lengths. Hence different colour signals transmitted over different pairs of cables will be delayed compared to signals transmitted over the same distance but having a shorter signal path length. This introduces a timing skew between the colour signals resulting in the colours appearing to be 'split' when recombined and displayed on a monitor. For example, a white colour block on a black background will appear to have a blue leading edge and a red trailing edge if the green signal is delayed with respect to the blue signal and the red signal is delayed with respect to both the blue and green signals.

Small amounts of colour split can be acceptable to a user. However, colour split problems are more noticeable at higher screen resolutions and refresh rates as the scan time for each horizontal line is reduced and so the skew delay becomes a larger proportion of the horizontal scan time. Also the colour split problem increases with the length of cable. Further, different cable manufacturers provide cables with different twist rates. The cables used to connect a KVM extender are often two or more cables connected together, e.g. by a patch panel, and so it is difficult to known with any accuracy the signal path differences that may arise in practice. Furthermore, newer cable types such as category 5e and category 6 cables tend to have higher twist rate differences exacerbating video signal skews.

Colour split is not always a problem, for instance over short distances and/or using lower resolution monitors, therefore it is not always necessary to provide some means to compensate for the differences in the video signal path lengths. However, a cheap and simple way of determining quantitatively when skew compensation may be required and the amount of skew compensation required would clearly be advantageous.

A previous method of providing skew compensation is the use of delay lines constructed from electronically and structurally complex capacitor and inductor networks. However, such networks that provide the high bandwidths required for video monitor colour signals are very expensive. Cheaper versions using less effective components tend to have more limited bandwidth and tend to result in an unacceptably blurred video image.

An alternative approach would be to use sections of twisted pair cables of various lengths. However, a skew compensation device constructed in this way would be bulky, and difficult and untidy to construct. Therefore a cheap and tidy skew compensation device would be advantageous.

SUMMARY OF THE INVENTION

According to a first aspect of the present invention, there is provided a device for reducing skew between colour video signals transmitted over at least two different video cables, the device including a plurality of video signal transmission tracks connectable to at least one of the video cables to increase the video signal transmission path length thereby more closely matching the total video signal path length for each of the colour video signals.

By connecting an appropriate length of track into a video signal transmission path, the paths lengths for each video signal can be made sufficiently similar that colour splitting is not discernable to a user.

Video cable means any conductor by which video signals can be transmitted. A video cable can have a single wire or multiple wires in it. Different video cables can be provided as separate cables or as parts of a single cable, such as a ribbon cable or the like. Preferably, each video cable comprises a twisted pair of wires.

Preferably, the tracks are selectively connectable. In this way a user can select a one or a few of the tracks so as to match the signal paths more closely.

Preferably, the tracks are selectively connectable to each of the cables. In this way all of the available tracks for each cable can be selectively connected to the cable so as to match the paths more closely.

Preferably all the tracks are on a single circuit board. The tracks can be provided on different layers of the circuit board. The tracks can be on separate circuit boards. The tracks can be configured so as to have an impedance substantially matching that of the video cables. Preferably the track impedance is substantially 100 ohms. The track material, spacing and separation can be selected so as to improve impedance matching. The tracks can be copper. Each track can comprise a pair of tracks. The tracks can have different lengths. Some of the tracks can have the same length. Preferably some of the tracks are twice the length of other tracks. Preferably, the tracks have a range of lengths. Preferably, the tracks can provide a delay length of up to approximately four to five metres. Preferably the tracks have a minimum delay length of not less than 0.2 metres.

The device can have sets of tracks, and each set of tracks can be associated with a different video colour signal. There can be four sets of tracks. Preferably, there are at least three sets of tracks.

According to a further aspect of the invention, there is provided a method for reducing skew between colour video signals transmitted over at least two different video cables comprising connecting a length of video signal transmission track into at least one of the video cables so as to more closely match the total video signal path length for each of the colour video signals.

According to a further aspect of the invention, there is provided a device for determining the amount of skew between colour video signals transmitted over at least two different video signal cables, the device comprising a processing device, a signal generator for applying measuring signals to each of the video signal cables and signal detection circuitry to receive measuring signals transmitted over the video signal cables and output detection signals to the processing device which is programmed to determine an indication of the transmission path length difference between the video signal cables.

Measuring signals transmitted over each video cable are processed so as to determine an indication of the delay owing to the different cable path lengths. In this way an accurate determination of the path length that needs to be added to the shorter cable so as to more closely match the signal path lengths can be obtained.

The detection signals can comprise delay signals and/or phase signals. The delay signals can be used to determine the path difference. The phase signals can be used to determine the relative length of the cables, i.e. which is longer. Detection signals can be provided for each different pair of cables.

The signal generator can produce individual pulses or a pulse stream. Preferably the pulse stream comprises constant width pulses and/or constant frequency pulses. The pulses can be substantially square pulses.

The signal detection circuitry can include a separation detection circuit and/or a phase detection circuit. The separation detection circuit can include an exclusive or gate. Measuring signals from two different video cables can be supplied to its inputs. The output of the XOR gate can be passed through a filter to provide an averaged output signal. The filter can comprise a resistor-capacitor network.

The phase detection circuit can include a D-type latch. Measuring signals from two different video cables can be supplied to its clock and data inputs. The data output from the latch can provide a phase signal.

The signal generator can be controlled to transmit two different types of measuring signals. Preferably a delay measuring signal and a phase measuring signal are provided. The phase measuring signal can have a lower rate than the delay measuring signal. Preferably the separation measuring signal has a frequency substantially a quarter of the clock speed of the processing device.

The microprocessor can be programmed to calculate a transmission path length difference between the video cables. The microprocessor can be programmed to determine a screen resolution that can be used without exhibiting significant colour splitting. The microprocessor can be programmed to indicate a switch configuration for a skew compensating device.

According to a further aspect of the invention, there is provided a method for determining the amount of skew between colour video signals transmitted over at least two different video signal cables, the method comprising the steps of: transmitting measuring signals over each of the video signal cables; detecting the measuring signals transmitted over the video signal cables; outputting detection signals to a processing device; and processing the detection signals to determine an indication of the transmission path length difference between the video signal cables.

According to a further aspect of the invention, there is provided a system for reducing skew between colour video signals transmitted over at least two different video signal cables comprising a skew compensating device and a skew determining device according to previous aspects of the invention.

According to a further aspect of the invention, there is provided a method for reducing skew between colour video signals transmitted over at least two different video signal cables, comprising carrying out the skew determining method and the skew correction method aspects of the invention in sequence.

According to a further aspect of the invention there is provided a KVM extender including devices according to previous aspects of the invention. In this way the colour split on a monitor can be corrected or an indication of the resolution at which the monitor should be used in order to avoid colour split can be obtained. The devices can be provided internally to or externally to the extender.

DESCRIPTION OF THE DRAWINGS

An embodiment of the invention will now be described, by way of example only, and with reference to the accompanying drawings, in which.

Similar items in different figures share common reference numerals unless indicated otherwise.

DETAILED DESCRIPTION OF THE INVENTION

Figure 1:
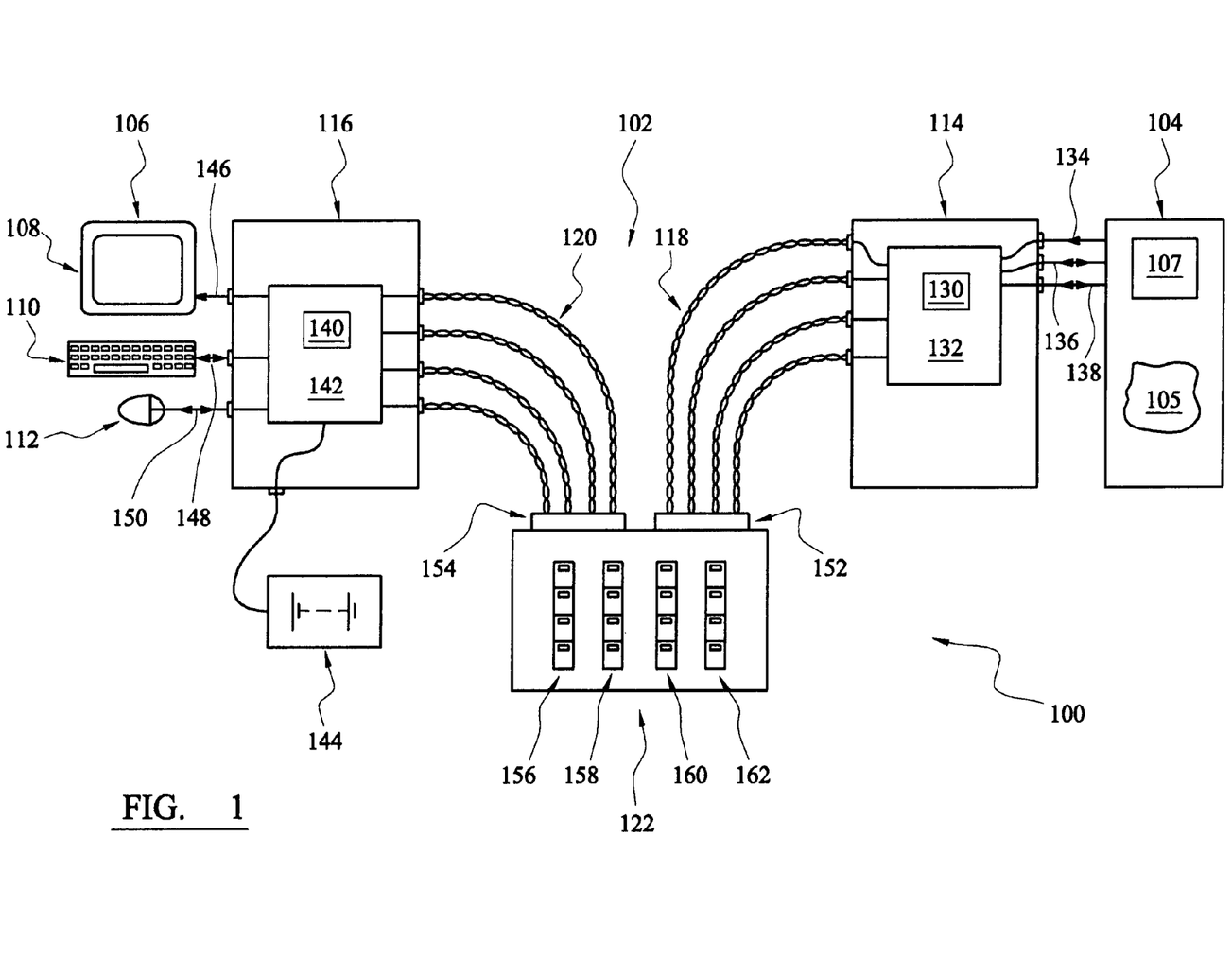
FIG. 1 shows a schematic block diagram of a KVM extender including a skew compensation device and skew determining device according to the present invention.

With reference to FIG. 1, there is shown a computer system 100 including a KVM extender 102 connecting a computer 104 executing software 105 to a KVM console 106 including a monitor 108, keyboard 110 and mouse 112. KVM extender 102 includes a local unit 114 and a remote unit 116 connected by a four twisted pair cable 118, 120 via a video signal skew compensation device 122.

Local unit 114 includes a microprocessor 130 controlling various signal processing and routing devices 132 as will be described in greater detail below. Respective video 134, keyboard 136 and mouse 138 cables connect the video, keyboard and mouse ports of the computer 104 to connectors of the local unit by which video signals are supplied to the remote unit and keyboard and mouse signals are transmitted between the remote unit and computer. The video signal comprises red, green and blue colour signals and vertical and horizontal synchronisation signals.

Remote unit 116 includes a microprocessor 140 controlling various signal processing and routing devices 142 as will be described in greater detail below. An external power supply 144 supplies electrical power to the remote unit. Respective video 146, keyboard 148 and mouse 150 cables connect the video monitor, keyboard and mouse to the remote unit allowing video signals to pass from the remote unit to the video monitor and keyboard and mouse signals to pass between the keyboard and mouse and remote unit. A suitable device for microprocessors 130, 140 is the PIC16F877 produced by Arizona Microchip Inc.

A first pair of twisted wires within the twisted pair cable carries the red video signal and horizontal synchronisation video signal. A second pair of twisted wires carries the green video signal and vertical synchronisation video signal. A third pair of twisted wires carries the blue video signal and a duplicate horizontal synchronisation signal which is not actually used to drive the monitor. The fourth pair of twisted wires provides a data cable carrying keyboard and mouse signals between the local and remote units.

The four twisted wire pairs cables connect the local and remote units via the skew compensation device 122. Depending on the context it will be understood that the term cable is used to refer to either a one of the four twisted pairs of wires or all four of them together as a single cable. Although the device is shown external to and between the local and remote units, it can be located adjacent or internal to either of the local or remote units.

Figures 2A, 2B, 2F:
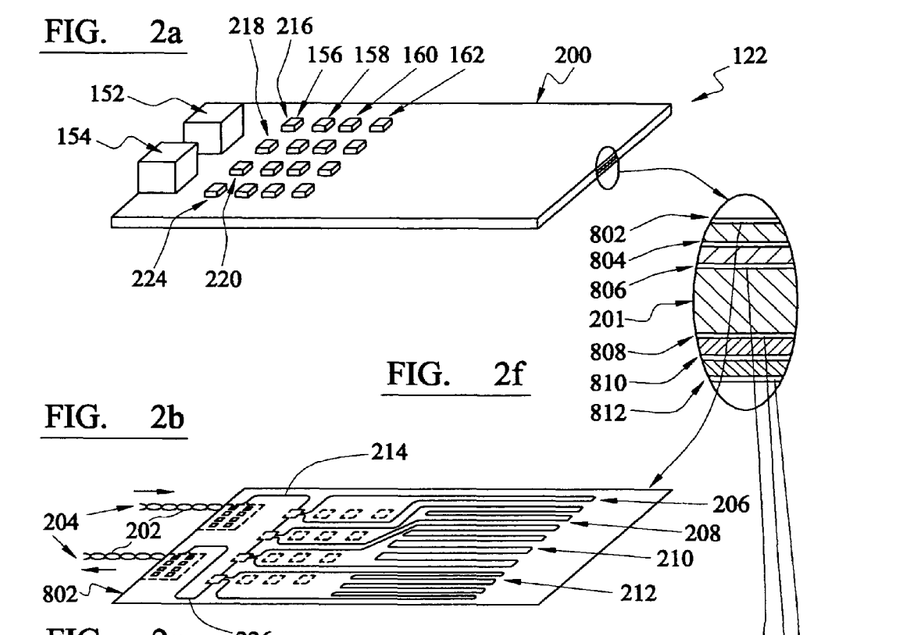
FIGS. 2a, 2b, 2c, 2d, 2e, 2f, 2g and 2h show respective schematic diagrams of the skew compensation device of FIG. 1, four circuit board layers, an enlarged cross sectional view and a switching part in different configurations.
Figure 2C:
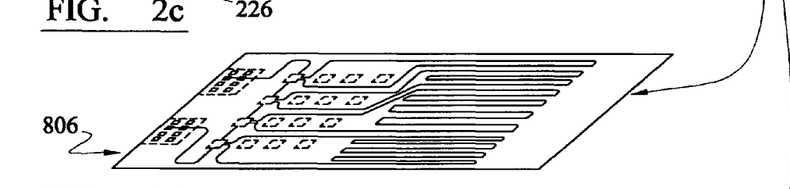
Figure 2D:
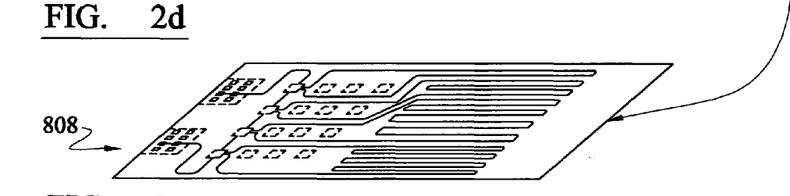
Figure 2E:
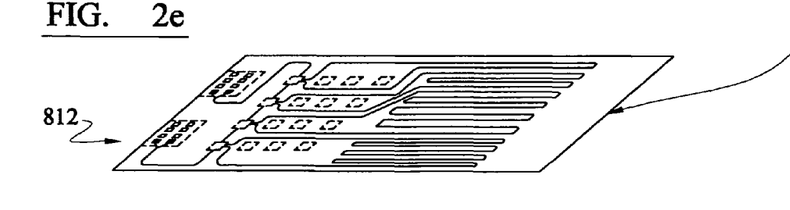

A first RJ45 connector 152 and a second RJ45 connector 154 are provided for the four twisted pair cable. Four banks 156, 158, 160 and 162 of switches, each comprising four independently operable switches, are provided on the top of the circuit board. Each bank of switches is associated with a respective twisted pair of the cable.

Skew compensation device 122 includes a six layer printed circuit board. FIG. 2a shows a schematic perspective view of the circuit board 200 of the skew compensation device, including the connectors 152, 154 and switch banks 156, 158, 160, 162. FIG. 2f shows an enlarged schematic cross-sectional side view 201 of the circuit board 200 illustrating its construction.

As shown in FIG. 2f, the circuit board has six layers 802-812. The connectors 152, 154 and the banks of switches 156, 158, 160, 162 are all located on the top layer 802 for ease of access. Four different lengths of pairs of tracks are provided on each of the top 802, third 806, fourth 808 and sixth 812 layers, being red, green, blue and data signal layers respectively.

The banks of switches 156-162 have contacts that extend through the circuit board layers to enable the appropriate length of track to be attached to the appropriate switch. Similarly, electrical contacts of the connectors extend down through the circuit board 200 so that the different pairs of the cable can each be connected to the switches on their respective layer. In practice, the tracking on each layer need not be organised on a colour by colour basis (as illustrated in FIGS. 2b-2e for the sake of clarity only), and is organised in the most convenient basis with the tracks for each colour arranged on different layers and the switch and connector contacts connected to appropriate tracks accordingly.

The second 804 and fifth 810 layers provide ground planes to the first and third and fourth and sixth layers respectively. There is no ground plane between the third and fourth layers, but their separation is sufficient to reduce cross talk between them.

The copper circuit board track width, copper thickness, track spacings and the circuit board materials and construction are arranged so that the each of the pairs of circuit board tracks have an impedance that is substantially $100\Sigma$, so as to match the impedance of typical network style twisted pair cabling. This maximises the performance of the skew compensation device by minimising signal reflections and maximising bandwidth. This construction enables the skew compensation device to support higher bandwidths than would be possible using conventional delay lines constructed using inductor and capacitor networks. A multiple layer circuit board 200 construction is used so as to reduce the overall size of the skew compensation device by distributing the tracks across several circuit board layers.

In the particular KVM extender embodiment described, a fourth set of compensation tracks is not necessary as the fourth twisted wire pair cable transmits only keyboard and mouse data. However, a fourth set of compensation tracks and associated switches is provided so that the device can be used with KVM extender devices which transmit video signals (colour and synchronisation) over four twisted pairs cables rather than only three, or using different pairs for the colour, synchronisation and data signals, e.g., not using the fourth pair as the data cable.

As illustrated in FIG. 2b, the red layer 802 of the circuit board has four pairs of copper circuit board tracks 206, 208, 210, 212 having increasing track lengths. (Although the tracks are shown as single lines in FIG. 2, each track actually comprises a pair of parallel tracks.) The length of the first pair of tracks 206 is approximately 16 inches (0.406 m), the second 208 is approximately 32 inches (0.813 m) the third 210 is approximately 64 inches (1.626 m) and the fourth 212 is substantially the same length as the third. This provides a 16 inch (0.41 m) resolution and a maximum length increase for the video signal transmission path of 176 inches (approximately 4.5 m). This range of increases of signal path lengths is suitable to compensate the length differences found in typical practical KVM extender applications, eg separations of up to 200 m using a Cat 5e cable, such as those provided by Alcatel. A plurality of skew compensation devices connected in series can be used for greater distances, e.g. 300 m.

An input track part 214, comprising a pair of tracks, is provided between the contacts of the connector for the red video cable and a first switch 216 of the bank of switches 156. Lengths of pairs of tracks connect the first, second 218, third 220 and fourth 224 switches. An output track segment 226, also comprising a pair of tracks, connects the fourth switch 224 to the red video cable output connection 154. Each of the four switches 216, 218, 220, 224 is identical and each is used to switch in or switch out the video signal path extension track connected to the switch as required.

Figure 2G:
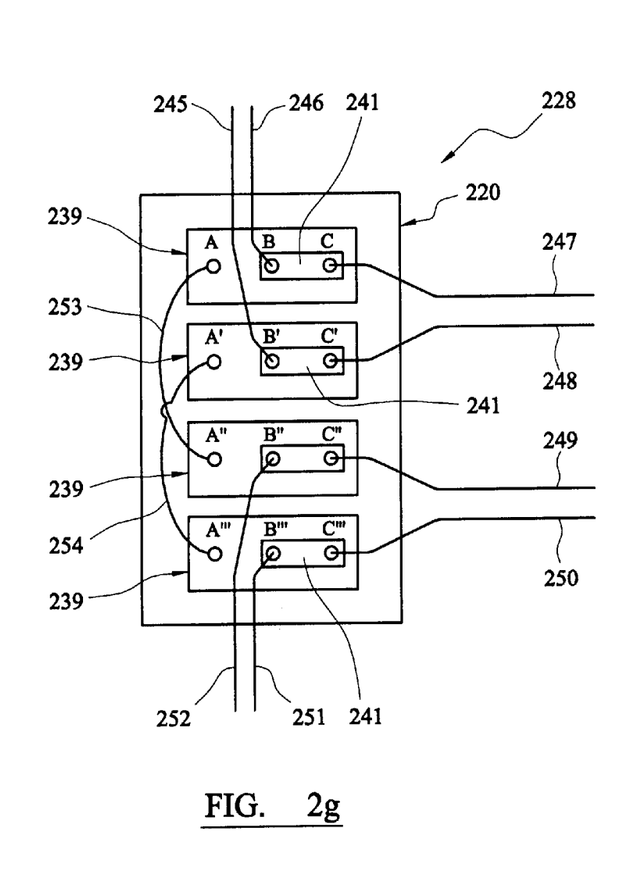
Figure 2H:
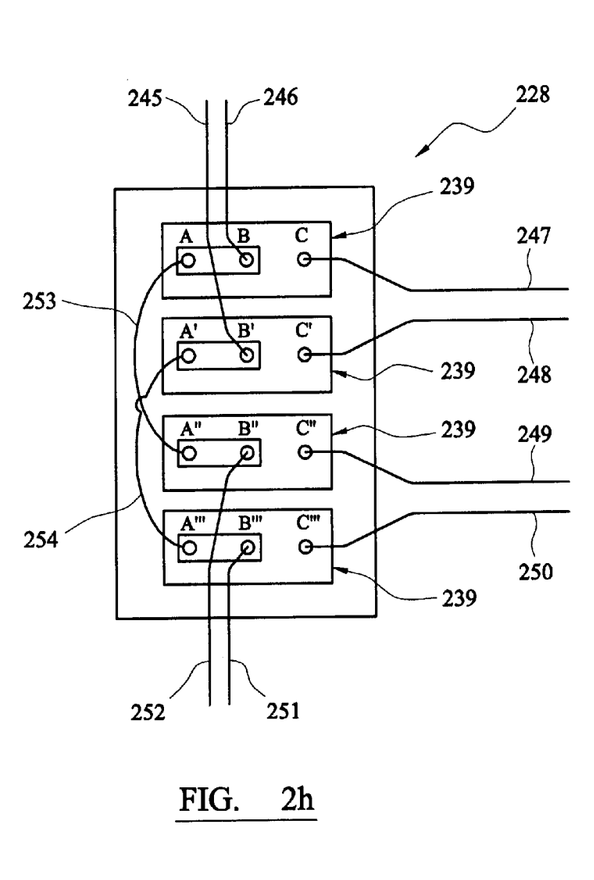

As shown in FIGS. 2g and 2h, each of the switches in each switch bank is constructed using four individual three pole-slider switches 239 which are operated together as a single switch. A suitable switch is the Jumper-Switch as provided by ERG Components. Each slider switch includes three pins, A, B, C-A''', B''', C''' and a contact 241 which can be slid to connect the poles A & B or B & C. Pins A and A'', and A' and A''', are respectively connected via a short circuit board track 253, 254. A first end of a pair of tracks 247, 248 are connected to pins C and C' and a second end of the same pair of tracks 249, 250 are connected to pins C'' and C'''. Pairs of tracks 245, 246 carry a signal into the switch and pairs of tracks 251, 252 carry a signal from the switch.

FIGS. 2g and 2h illustrate each of the switches in a track switched in 228 and a track switched out 230 configuration respectively. All four switches are operated together. With the sliding contact connecting the B and C poles, a length of track is added into the signal transmission path (FIG. 2g) and with the sliding contact connecting the A and B poles the extra length of track is bypassed (FIG. 2h). By switching lengths of circuit board tracks in, the overall signal transmission path length for a video signal is increased so that the signal transmission path length differences introduced by the different twisted wire pair cables may be compensated for. As indicated above, the pins of connector 152 that connect to the red cable wires 202 are connected to input and output tracks 214, 226 on the red layer 802, but not the other layers. Similarly the connector pins of the bank of red switches 156 pass through the circuit board but are only connected to the tracks used to delay the red signal 206-212.

The skew compensation device 122 does not change the electrical configuration of the connection of the video cables, i.e. it does not interchange twisted wire pairs. It can merely selectively increase the overall signal transmission path length for each cable by switching in lengths of circuit board tracks.

For example, suppose that the actual length of the twisted pair cable carrying the blue video signal is 200 m, the actual length of the cable carrying the red colour signal is 201.6 m and the actual length of the cable carrying the green colour signal is 203.2 m. In order to compensate for the length differences in this case, the switches of the skew compensation unit needs to be configured to add no additional length into the green cable, 1.6 m into the red cable and 3.2 m into the blue cable so that the video signal transmission length of all three video cables substantially the same, i.e. 203.2 m. This compensation can be achieved by using the third switch of the bank of red switches to switch in approximately 1.6 m and the third and fourth switches of the bank of blue switches 160 to switch in approximately 3.2 m.

It will be appreciated that a perfect signal transmission path length match cannot always be achieved. It is sufficient if the match between the signal transmission path lengths is sufficient to reduce the level of colour split on the video monitor to a level acceptable by a user or substantially undetectable to the human eye.

The minimum delay line length used in the device is determined by the pixel time and being able to provide a skew time (ie colour signal separation) that is approximately one half or less of the pixel time. The pixel time depends on the screen resolution and refresh rate and is approximately the reciprocal of the product of these factors (neglecting the vertical and horizontal synchronisation times). For a high resolution screen (1600×1280 pixels) at a 100 Hz refresh rate the pixel time is about 4.9 ns. The typical speed of electrical signals down a twisted pair cable is approximately two thirds of the speed of light. Therefore a length of approximately 0.49 m represents about one half of the pixel time. The minimum length of 0.41 m mentioned above provides a delay of about 2 ns which is about 40% of the pixel time. Taking into account some overhead a minimum length of around 0.25 m would be practical for current high resolution display devices.

In terms of maximum delay lengths required, a difference of four metres per hundred metres between cables is at the higher end of the range for twisted pair cables. A more typical value is between 1 and 2.5 m per 100 m. Therefore for a 200 m KVM extender a maximum delay length of about 4 to 5 metres per skew compensation device is appropriate.

Figure 3:
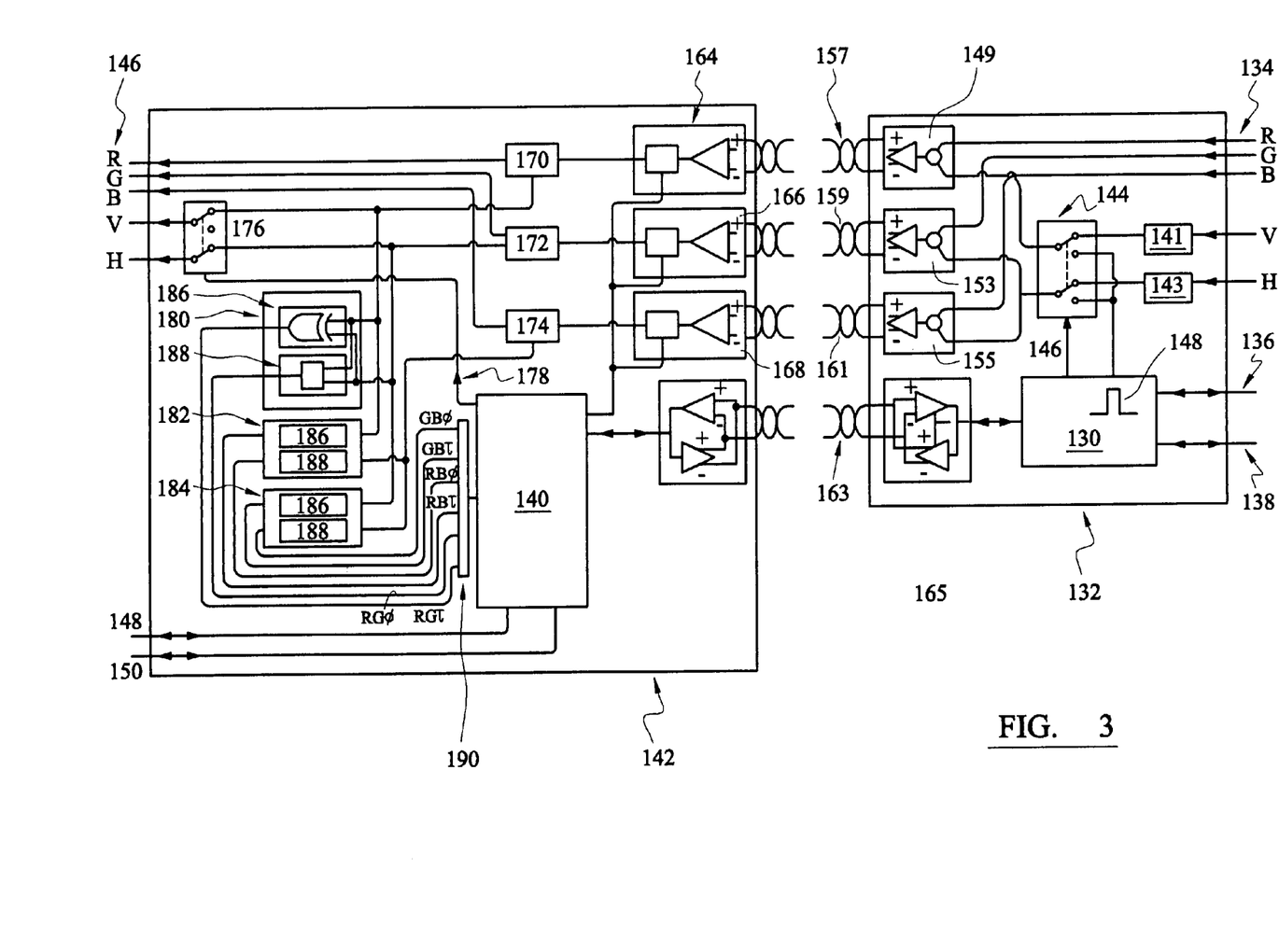
FIG. 3 shows a more detailed schematic block diagram of parts of the KVM extender shown in FIG. 1.

The KVM extender 102 includes circuitry 132 and 142 which provides a device for determining the length of compensating track that is required to substantially remove any video timing skew. FIG. 3 shows circuits 142 and 132 of the remote and local units in greater detail.

Local unit 132 includes vertical synchronisation and horizontal synchronisation signal polarity conversion circuits 141, 143 which ensure that a negative polarity synchronisation signal is always available (irrespective of the polarity of the synchronisation signal supplied to the device) to be added to the colour signals. They are connected to a switch 144 operable under control of a switching control signal 146 from microprocessor 130. Microprocessor 130 includes a pulse generator 148 which can supply electrical pulses to switch 144. First, second and third differential line driver ICs 149, 153, 155 are provided and are respectively connected to the red, green and blue video cables 157, 159, 161. A transceiver circuit 165 is connected to microprocessor 130 and also to a connector for the keyboard and mouse data cable 163 to transmit and receive data signals.

Remote unit circuitry 142 includes first, second and third differential receiver circuits 164, 166, 168 each including associated attenuation compensation circuitry, each connected to a respective one of the red, green and blue video cables. The microprocessor 140 can control the attenuation compensation provided by these circuits. Three synchronisation signal recovery circuits 170, 172, 174 are connected to the output of the differential line receivers and compensation circuits. Respective outputs of the synchronisation signal recovery circuits provide the red, green or blue video signals and another of the outputs of the red and green recovery circuits is connected to a switch 176. Switch 176 is connected to microprocessor 140 and is operable by control signal 178.

Three skew detection circuits 180, 182 and 184 are provided. Each skew measuring circuit is the same and includes a pulse separation detecting circuit 186 and a pulse phase detecting circuit 188. The operation of the three circuits is identical and so will be described in detail below for one of them only. The output of the red synchronisation signal recovery circuit is supplied as an input to both the separation and phase detecting circuits of the first and second measuring circuits. The output of the green synchronisation signal recovery circuit 172 is provided as an input to both the separation and phase detecting circuits of the first and third detection circuits. The output of the blue synchronisation signal recovery circuit 174 is provided as an input to both the separation and phase detecting circuits of the second and third detecting circuits 182, 184. The output of each of the separation and phase detecting circuits of each of the detecting circuits is provided as an input to the microprocessor 140.

In normal use, the vertical synchronisation signal is added to the red video signal and transmitted over the red twisted pair video cable to the remote unit where the vertical synchronisation signal is extracted and similarly for the green video signal and horizontal synchronisation video signal. The blue video signal is transmitted with the horizontal synchronisation signal. Keyboard and mouse data is transmitted backward and forward between the remote and local units and the conversion of mouse and keyboard data for transmission over the data twisted pair wires 163 is handled by microprocessors 140 and 130.

Figure 4:
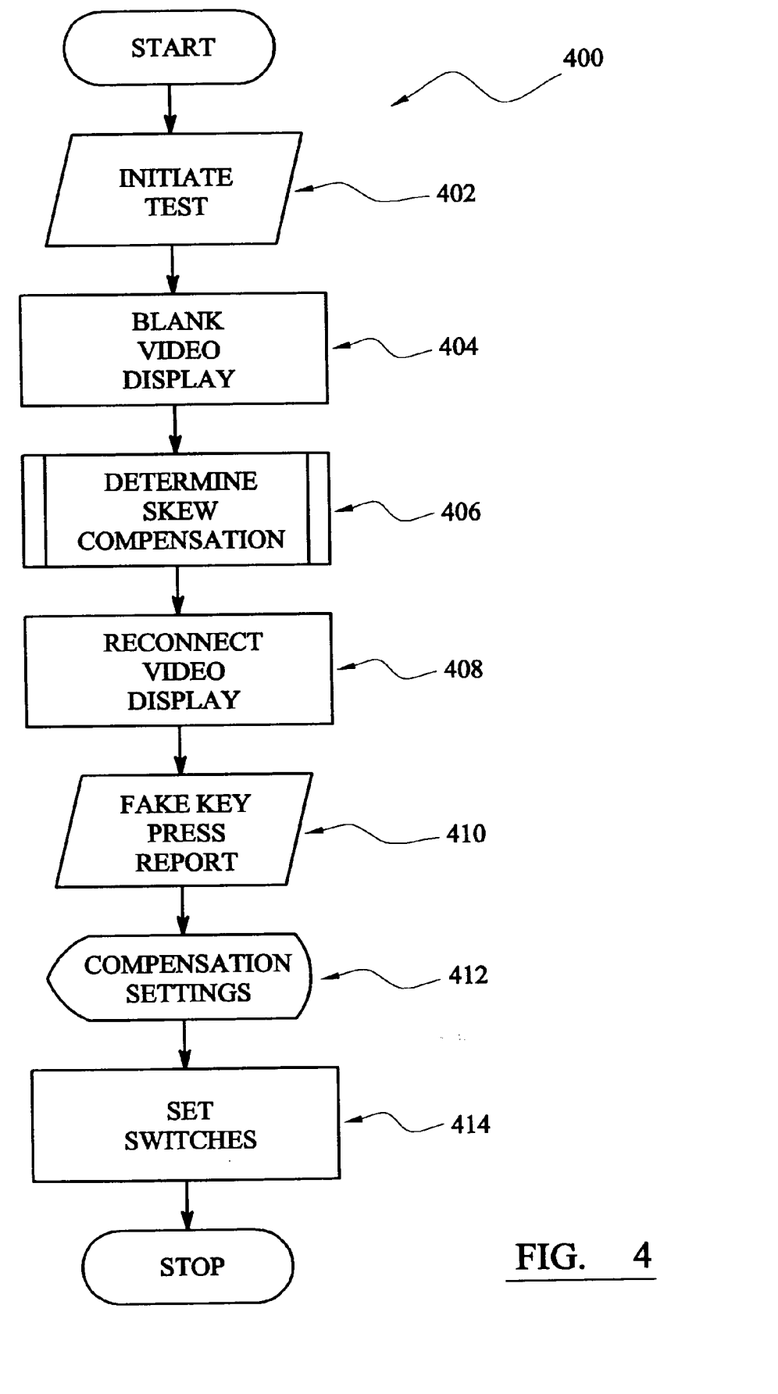
FIG. 4 shows a flowchart illustrating a method of operation of the KVM extender to determine skew compensation and making skew compensation.

Use of the compensation determining device of the KVM extender and compensating for video skew using the compensation device 122 will now be described with further reference to FIG. 4 which shows a flow chart illustrating the general process 400 by which the amount of skew compensation required is determined and compensated for. The remote and local units are either connected directly together by the four pair twisted wire cable or alternatively via the skew compensation device with all the switches set so as to introduce no delay into any of the twisted pairs. A user of the extender uses the KVM console to run a reporting application 105 on computer 104. The reporting application can be any software program which will display key presses on the keyboard as characters on the monitor 108 such as a simple word processor, editor or DOS command line application.

The user initiates a skew compensation test and report 402 by typing a hot key sequence on the keyboard 110. This sequence is detected by microprocessor 140 which communicates with processor 130 over the data cable to blank 404 the video display. The monitor display is blanked by isolating the horizontal and vertical synchronisation signals to the video monitor by using a logic switch and holding the horizontal and vertical synchronisation signals to the monitor at 0V. The blank video display indicates a skew compensation test is being carried out and a report is being generated. Microprocessors 140, 130 are suitably programmed to automatically carry out a skew compensation test 406 without further user intervention. This will be described in greater detail below with reference to FIGS. 5 and 3.

Once the test has been completed and the video signal transmission path differences have been calculated, the picture is restored by re-connecting the vertical and horizontal synchronisation signals using the logic switch. Microprocessor 140 generates fake key press data 410 corresponding to the text of the report which are transmitted over the data cable to the local unit. The results of the test and the test data is output over the keyboard cable 136 to the graphics controller 107 of computer 104. The video picture generated by the graphics controller is displayed 412 on the monitor 108 for the user. The report data generated by the microprocessors includes the length differences between the cables, the recommended switch settings for the switches of the compensation device and a recommended resolution above which the skew compensation device should be used.

For example, the following report would suggest the use of a skew compensation unit for resolutions above 640×480 pixels and tells the user the switch configurations to set when using the skew unit to minimise skew.

| COLOUR SKEW REPORT LENGTH DIFFERENCES | |
|---|---|
| Green | +0 m |
| Red | +1.6 m |
| Blue | +3.2 m |
| SWITCH SETTINGS | |
| Green | all off |
| Red | 1 on |
| Blue | 1, 2 on |

Max resolution without skew unit 640×480 at 65 Hz.

The user can then introduce the skew compensation unit, if not already present, and set 414 the switches 156, 158, 160 as indicated in the displayed report. The user can then run the test and report again and if the skew compensation unit has been correctly configured, then the skew report should indicate minimal length differences. The video signal transmission path length matching will also be apparent from the improvement in the video picture displayed on the monitor 108.

As an alternative to manual switches, electronically controlled switches are provided in the skew compensation device and processor 140 generates and transmits control signals over the keyboard and mouse data twisted pair to switch control circuitry in the device to automatically set the required delays. The steps of generating a report and displaying the required settings are not required in order to provide skew compensation, but may still be provided to inform the user.

Figure 5:
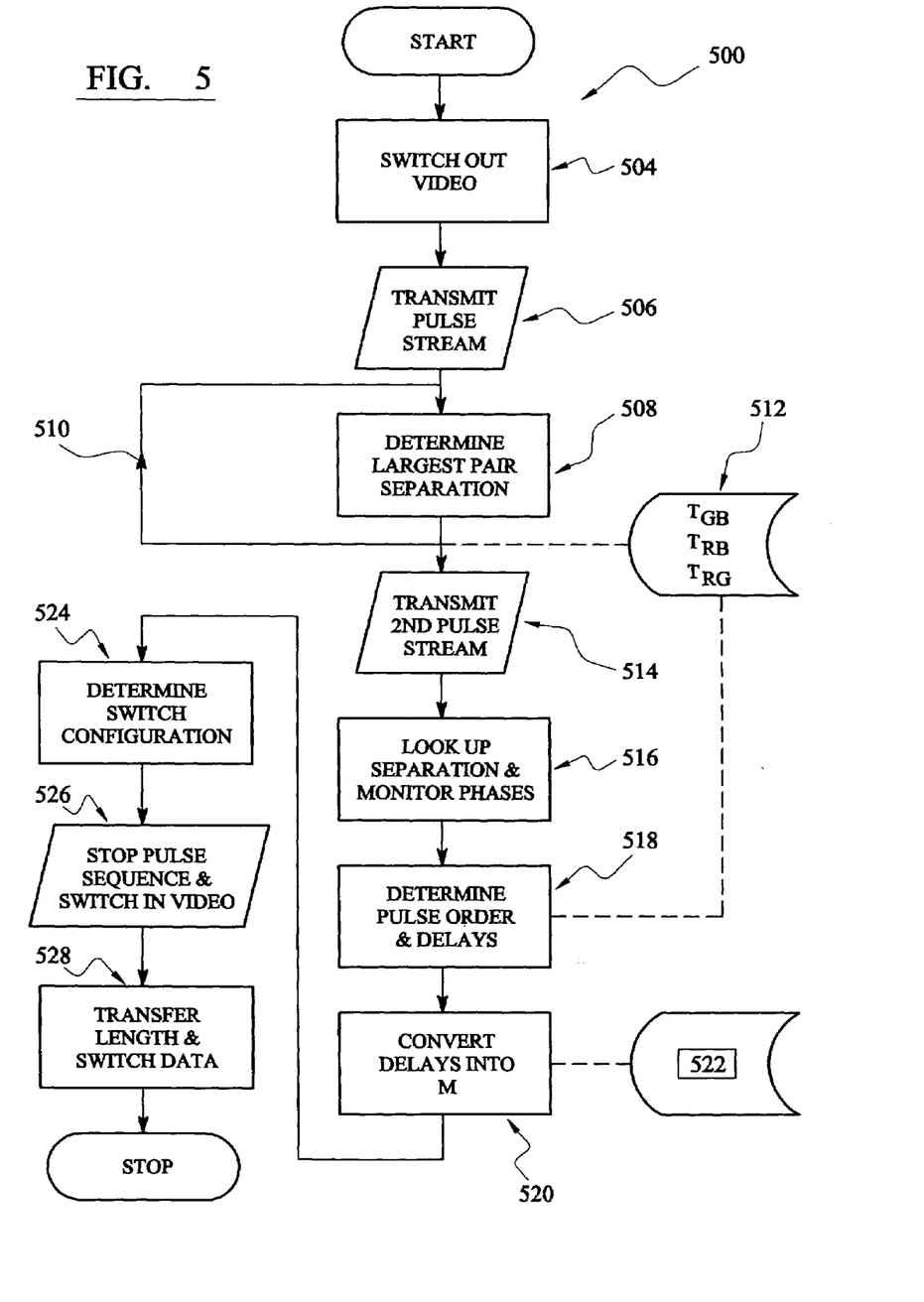
FIG. 5 shows a flowchart illustrating a determining skew compensation part of the flowchart of FIG. 4 in greater detail.

The method of determining the required skew compensation 406 implemented by the microprocessors 140, 130 under control of suitable software will now be described with reference to FIG. 5. The microprocessors in the local and remote units are in communication via the data cable and pass data and control signals between themselves as required. Microprocessor 140 in the remote unit controls the overall process. Microprocessor 140 detects the hot key sequence initiating a test and generates a control signal 178 operating switch 176 to switch out the vertical and horizontal synchronisation signals from the video signals. Microprocessor 140 communicates with microprocessor 130 which generates switching control signal 146 to operate switch 144 to also switch out the horizontal and vertical synchronisation signals.

Figure 6A:
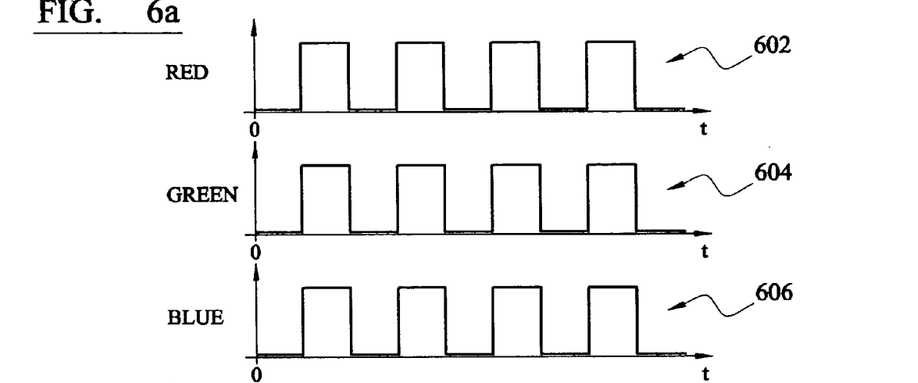
FIGS. 6a, 6b and 6c respectively show transmitted and received pulse sequences and an output signal of a separation detector part of FIG. 3.
Figure 6B:
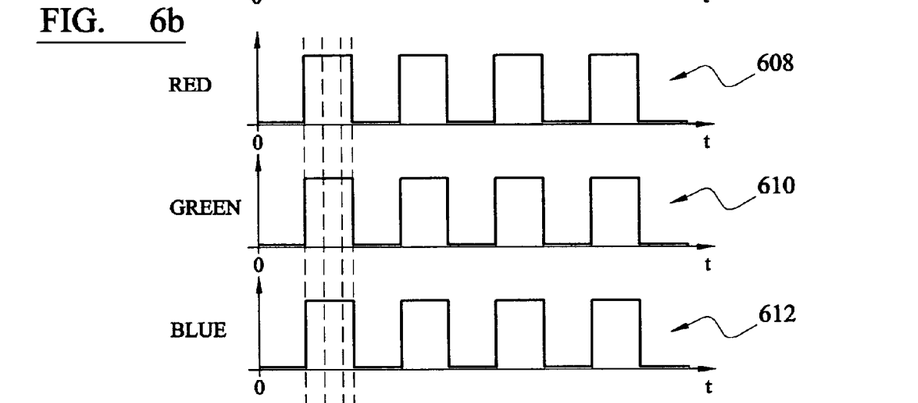
Figure 6C:
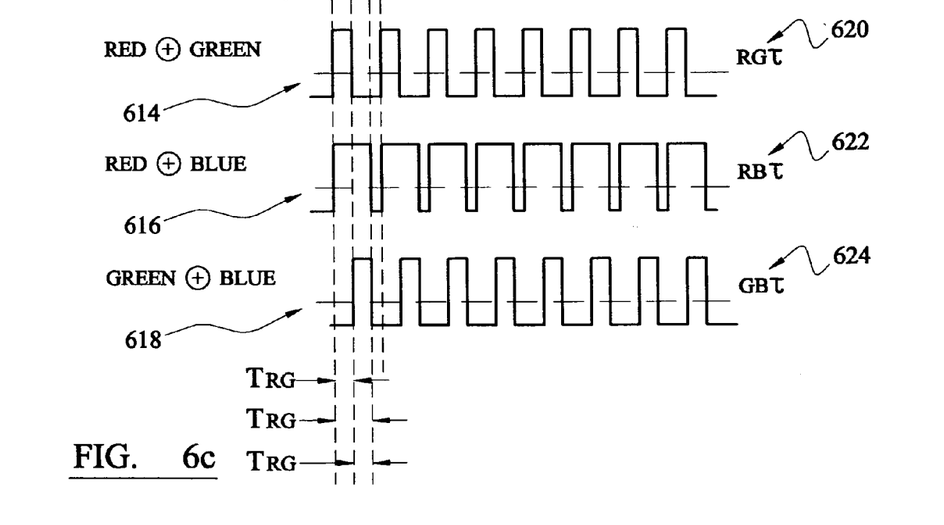

The remote processor 140 then signals the local processor 130 to start generating and outputting 506 a pulse stream. FIGS. 6*a, b* and *c* show diagrams illustrating the pulses transmitted, the pulses received and the outputs of the separation detecting circuits. The signal generator 148 generates a steam of constant width pulses at a frequency of approximately 4 MHz which are simultaneously applied to each of the red, green and blue cables via switch 144. A 16 MHz clock frequency microprocessor is used and so a 4 MHz is the fastest that can be used as four instructions are required in order to obtain an output under software control (i.e., one quarter of the frequency of the microprocessor).

As each of the twisted pairs has a different twist rate, and therefore different overall signal transmission path lengths, the pulses applied at the local unit 114 will arrive at the remote unit 116 at different times. The pulses applied to and transmitted over the red wires 157, green wires 159 and blue wires 161 will be referred to as the red 602, green 604 and blue 606 pulses respectively, although they are not colour signals but measurement pulses. The pulses from each of the colour cables are passed through the differential line receiver and video compensation circuits 164, 166 and 168 which boosts the received signals to compensate for the attenuation within the cables. Each of these signals is then passed through a respective synchronisation signal recovery circuit 170, 172, 174 which provides the received red 608, green 610 and blue 612 pulses as output signals. As shown in FIG. 6*b*, the red pulses have been received first, followed by the green pulses and finally the blue pulses.

The red pulse is supplied as an input to the first and second skew detection circuits 180, 182. The green pulse is supplied as an input to the first and third skew detection circuits 180, 184. The blue pulse is supplied as an input to the second and third skew detection circuits 182, 184.

Each separation detection circuit 186 receives as an input two different colour pulses. The separation detection circuit comprises an exclusive or (XOR) gate the output of which is fed into a resistor-capacitor network (not shown). The output of the XOR gate is high for as long as a pulse is received at either, but not both inputs. FIG. 6*c* shows the output signal of each of the XOR gates for the red and green pulses 614, the red and blue pulses 616 and the green and blue pulses 618.

The duration of the high output of the XOR gate is proportional to the temporal separation of the input pulses and therefore the length difference of the cables over which the pulses have been transmitted. For example in FIG. 6*c*, TRG is the width of the output signal from the red and green XOR gate which is equivalent to the temporal separation of the red and green pulses, and similarly TRB and TGB for the red and blue and green and blue pulses respectively.

The resistor-capacitor network is used as a low pass filter and the voltage stored on the capacitor provides an analogue voltage from the output pulse stream which is used as an indication of the length difference between the pairs. The average signal value for each of the XOR outputs is indicated in FIG. 6c by dashed lines 620, 622 and 624. As can be seen, the greater the separation of the pulses, the greater the width of the XOR gate output and therefore the higher the time average signal RGϑ, RBϑ, GBϑ. The higher the frequency of the transmitted pulses, the greater the largest possible DC average voltage and therefore the output signal can be measured more accurately. The capacitor and resistor values are chosen so as to maximise the DC voltage possible at this frequency.

The average colour pulse separation signal (GBϑ, RBϑ, RGϑ) from each separation detector circuit is supplied as an input to a analogue to digital convertor of microprocessor 140 via a switch 190. The analogue to digital convertor provides a digital value which indicates which of the analogue voltages applied is the largest and therefore which pair of colour signals has the greatest temporal separation. Once the processor has determined 508 which pair of colour pulse signals has the greatest separation, then the remaining one of the colour pulse signals must be the intervening one. For instance if the average separation between the green and blue signals (GBϑ) is determined to be the greatest then the red signal must have been received between reception of the green and blue signals. The step of determining the largest pair separation 508 is repeated a number of times 510 to establish an average value.

These average values GBϑ, RBϑ and Rϑ, are then stored 512 in a memory of microprocessor 140 for later use by a calculation routine which will determine a length difference in m between the three cables.

Local processor 140 then signals to the remote processor 130 over the data cable 162 to generate and transmit 514 a second set of fixed width pulses at a lower constant pulse frequency of 1 MHz. This frequency is slower than that used for the separation pulses so as to give the microprocessor sufficient time to determine the output from the phase detecting circuit. The pulses are transmitted over the red, green and blue cables and received by the remote unit. The received red pulse is supplied as an input to the phase detecting circuit 188 of the first and second measurement circuits, the green pulse to the phase detecting circuit of the first and third measurement circuits and the blue pulse to the phase detecting circuit of the second and third measurement circuits.

Each phase detection circuit 188 consists of a D-type latch. Two different colour pulses are applied to the data and clock inputs of the D-type latch. If a pulse is received at the data input first then the output of the latch will be high. If a pulse is received at the clock input first then the output will be low. The output of each phase detecting circuit is supplied as an input to the microprocessor 140.

The microprocessor 140 uses a simple look-up table to determine 516 which of the pulse phase signals GBN, RBN, RGN to use. The microprocessor needs to use the phase information for the pair of colour signals having the largest temporal separation. The look up table therefore tells the microprocessor to monitor the phase signal from the measuring circuit 180, 182, 184 which previously supplied the largest separation voltage. For instance if the green, blue pulse separation was the greatest then the microprocessor monitors the green blue phase signal GBN from measuring circuit 184. The connections of the green and blue pulses to the D type latch are hard wired and so depending on whether the phase output signal is high or low the processor can determine 518 that either the green or blue pulse was received first. The pulse that was received first has travelled the shortest distance and therefore corresponds to the shortest signal transmission path length. The other of the pair of colour pulses must have travelled the longest distance and the third colour pulse must have travelled along the cable with the intermediate length.

Microprocessor 140 therefore has access to data indicating the sequence in which the pulses were received. The cable over which the last received pulse was transmitted requires no delay and the remaining two cables require some delay adding. The averaged separation data TGB, TRB, TRG which represents the difference in signal path transmission length of the cables is then used 520 together with stored conversion data 522 to convert the stored separation data into required delay line length values in metres. The processor then determines 524 the switch settings most closely matching the required delay lengths.

A look-up table is used by the microprocessor to determine the screen resolution that should be used with a particular timing delay. The approximate time per pixel can be calculated from the reciprocal of the product of the screen resolution and the refresh rate. For example the time per pixel for a 1024×768 resolution screen with a refresh rate of 75 MHz is approximately $1/(1024 \times 768 \times 75) = 16.95$ ns. Therefore if the time delay between colour signals approaches this value, or is greater, then colour split will become evident to a user. Therefore a look up table of various common screen resolutions and refresh rates is provided which is accesses based on the calculated delay, so that the user can be told what is the maximum resolution that can be used without noticeable colour split.

The frequencies of the test pulses and components used are selected to give an analogue voltage of 200 mV per metre length difference between cables. A voltage of 50 mV therefore represents a length of 0.25 m.

Before calculating 520 the actual length values, it is necessary to use calibration data previously stored during a system calibration process. This calibration information takes into account the small differences in component tolerances between the circuits of the local and remote units. A system calibration is run by connecting the remote and local units together with a short twisted pair cable, e.g. of less than 0.5 m. The system calibration process is initiated by using a different hot key sequence at the remote unit. The calibration process is identical to the skew measurement process with the exception that calibration offset data is stored in an EEPROM within microprocessor 140 and is therefore accessible to the calculation routine 520.

The remote processor then signals 526 to the local processor to stop generating the pulse sequence and to apply a control signal to switch the video signals back in. The remote processor 140 then switches the video signals back in on the remote unit so that the video monitor can display an image again.

Skew compensation report data is then transferred 528 from the remote unit to the local unit via the data cable. The local processor 130 then generates fake key press data which are transmitted to the computer 104 and displayed as text characters in a DOS window or text editor window of the display program 105.

The compensation determining device described is suitable for use with any system in which video signals are transmitted over cables and video signal skew occurs. It can advantageously be provided in a KVM extender to provide an indication of when a compensation device should be used with the extender or what display resolution should be used in order to avoid colour split. Therefore it is beneficial to provide a skew determination device irrespective of whether a skew compensation device is also used with a KVM extender.

What is claimed is:

1. A device for determining the amount of skew between colour video signals transmitted over at least two different video signal cables, the device comprising a processing device, a signal generator for applying measuring signals to each of the video signal cables and signal detection circuitry to receive measuring signals transmitted over the video signal cables and output detection signals to the processing device which is programmed to determine an indication of the transmission path length difference between the video signal cables, in which the detection signals comprise delay signals and phase signals.

2. A device as claimed in claim 1, in which the signal generator produces a pulse stream.

3. A device as claimed in claim 1, in which the signal detection circuitry includes a separation detection circuit and a phase detection circuit.

4. A device as claimed in claim 3, in which the separation detection circuit includes an exclusive or gate having measuring signals from two different video cables at its inputs.

5. A device as claimed in claim 3, in which the phase detection circuit includes a D-type latch having measuring signals from two different video cables at its clock and data inputs.

6. A device as claimed in claim 1, in which the signal generator is controlled to transmit two different types of measuring signals.

7. A device as claimed in claim 1, in which the processing device is programmed to determine a transmission path length difference between the video cables.

8. A device as claimed in claim 1, in which the processing device is programmed to determine a screen resolution that can be used without exhibiting significant colour splitting.

9. A device as claimed in claim 1, in which a compensation device setting report is output using fake key press data.

10. A Keyboard Video and Mouse extender including a device as claimed in claim 1.

11. A method for determining the amount of skew between colour video signals transmitted over at least two different video signal cables, the method comprising:
- transmitting measuring signals over each of the video signal cables;
- detecting the measuring signals transmitted over the video signal cables;
- outputting detection signals to a processing device, wherein the detection signals comprise delay signals and phase signals; and
- processing the detection signals to determine an indication of the transmission path length difference between the video signal cables.

12. A method for reducing skew between colour video signals transmitted over at least two different video signal cables, the method comprising:
- transmitting measuring signals over each of the video signal cables;
- detecting the measuring signals transmitted over the video signal cables;
- outputting detection signals to a processing device, wherein the detection signals comprise delay signals and phase signals;
- processing the detection signals to determine an indication of the transmission path length difference between the video signal cables;
- connecting a length of video signal transmission track into at least one of the video cables; and
- using said length of video signal transmission track to more closely match the total video signal path length for each of the colour video signals, in which said length of video signal transmission track comprises a pair of copper tracks.

* * * * *